United States Patent
Nomura et al.

(10) Patent No.: US 8,105,687 B2
(45) Date of Patent: *Jan. 31, 2012

(54) ELECTROCONDUCTIVE BONDING MATERIAL AND ELECTRONIC APPARATUS

(75) Inventors: Akihiro Nomura, Moriyama (JP); Hidekiyo Takaoka, Omihachiman (JP); Kosuke Nakano, Kusatsu (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/959,752

(22) Filed: Dec. 3, 2010

(65) Prior Publication Data

US 2011/0067912 A1    Mar. 24, 2011

Related U.S. Application Data

(63) Continuation of application No. 12/394,113, filed on Feb. 27, 2009, which is a continuation of application No. PCT/JP2007/066475, filed on Aug. 24, 2007.

(30) Foreign Application Priority Data

Aug. 28, 2006  (JP) .................................. 2006-230726

(51) Int. Cl.
*B32B 7/12* (2006.01)
*H01L 23/29* (2006.01)

(52) U.S. Cl. ......... 428/356; 257/789; 257/795; 252/512

(58) Field of Classification Search .................. 257/789, 257/795; 252/512, 518; 428/356
See application file for complete search history.

(56) References Cited

U.S. PATENT DOCUMENTS

| | | |
|---|---|---|
| 5,376,403 A | 12/1994 | Capote et al. |
| 5,641,996 A | 6/1997 | Omoya et al. |
| 5,853,622 A | 12/1998 | Gallagher et al. |
| 6,207,259 B1 | 3/2001 | Iino et al. |
| 6,270,363 B1 | 8/2001 | Brofman et al. |
| 6,359,235 B1 | 3/2002 | Hayashi |
| 6,558,780 B2 | 5/2003 | Suzuki et al. |
| 7,022,266 B1 | 4/2006 | Craig |
| 7,157,800 B2 | 1/2007 | Sano et al. |

FOREIGN PATENT DOCUMENTS

| | | |
|---|---|---|
| JP | 4-345701 | 12/1992 |
| JP | 2000-517092 | 12/2000 |
| JP | 2001-44590 | 2/2001 |
| JP | 2004-10828 | 1/2004 |
| JP | 2004-335872 | 11/2004 |
| JP | 2004-363052 | 12/2004 |
| JP | 2005-93826 | 4/2005 |

*Primary Examiner* — Cathy Lam
(74) *Attorney, Agent, or Firm* — Dickstein Shapiro LLP

(57) ABSTRACT

An electroconductive bonding material contains a thermosetting resin, a low-melting-point metal powder which is melted at a temperature equal to or lower than the thermosetting temperature of the thermosetting resin, a high-melting-point metal powder which is not melted at a temperature equal to or lower than the thermosetting temperature of the thermosetting resin and which reacts with the low-melting-point metal powder to form a reaction product having a high melting point of 300° C. or higher during heat-hardening of the thermosetting resin, and a reducing substance which removes an oxide formed on the surface of the high-melting-point metal powder. The total content of the low-melting-point metal powder and the high-melting-point metal powder is 75% to 88% by weight, and the particle size ratio D1/D2 of the average particle size D1 of the low-melting-point metal powder to the average particle size D2 of the high-melting-point metal powder is 0.5 to 6.0. Thereby, an electroconductive bonding material is provided which has good conduction properties and high connection strength even when reflow heat treatment is repeatedly carried out or thermal shock accompanied with a rapid temperature change is applied to the electroconductive bonding material, and an electronic apparatus using such an electroconductive bonding material.

7 Claims, 4 Drawing Sheets

ELECTROCONDUCTIVE BONDING MATERIAL AND ELECTRONIC APPARATUS

CROSS REFERENCE TO RELATED APPLICATIONS

The present application is a continuation of application Ser. No. 12/394,113, filed Feb. 27, 2009, which is a continuation of International Application No. PCT/JP2007/066475, filed Aug. 24, 2007, which claims priority to Japanese Patent Application No. JP2006-230726, filed Aug. 28, 2006, the entire contents of each of these applications being incorporated herein by reference in their entirety.

FIELD OF THE INVENTION

The present invention relates to an electroconductive bonding material and an electronic apparatus. More particularly, the invention relates to an electroconductive bonding material which bonds electric structures, such as chip electronic components and printed circuit boards, to each other and an electronic apparatus in which a plurality of electric structures are bonded to each other through the electroconductive bonding material.

BACKGROUND OF THE INVENTION

Electronic apparatuses are known in which a plurality of electric structures are bonded to each other using an electroconductive adhesive containing a thermosetting resin and a metal powder.

For example, Patent Document 1 proposes a connected structure in which, as shown in FIG. 6, a first electrode 102 is disposed on a substrate 101, a second electrode 104 is disposed on an electronic device 103, the first electrode 102 and the second electrode 104 are connected to electrode-connecting parts 105 in which conduction is ensured by fusion-bonding of metal fine particles, an intermediate connecting part 106 is interposed between the electrode-connecting parts 105, the metal fine particles are fusion-bonded to each other at a temperature equal to or lower than the thermosetting temperature of the electroconductive adhesive, and the electroconductive adhesive contains an electroconductive filler having a particle size that does not allow the particles to be fusion-bonded to each other at a temperature equal to or lower than the thermosetting temperature of the electroconductive adhesive.

In Patent Document 1, the electrode-connecting parts 105 are composed of an electroconductive adhesive containing metal fine particles, such as Ag, that are fusion-bonded to each other at a temperature equal to or lower than the thermosetting temperature of the electroconductive adhesive, an electroconductive filler having a particle size that does not allow the particles to be fusion-bonded to each other at a temperature equal to or lower than the thermosetting temperature of the electroconductive adhesive, and an adhesive.

Furthermore, in Patent Document 1, by means of heat-hardening treatment, the first electrode 102 and the second electrode 104 are fusion-bonded to the electroconductive filler through the metal fine particles contained in the electrode-connecting parts 105, and the electroconductive filler particles are fusion-bonded to each other through the metal fine particles, thereby improving adhesion at interfaces.

Patent Document 2 proposes a thermally conductive bonded member in which, as shown in FIG. 7, a first substrate 107 and a second substrate 108 are bonded to each other through a thermally conductive material 109.

The thermally conductive material 109 proposed in Patent Document 2 includes a thermosetting resin 110 containing an organic acid, and a thermally conductive filler. The thermally conductive filler includes a first filler 111 having a melting point higher than the thermosetting temperature of the thermosetting resin 110 and a second filler 112 having a melting point lower than the thermosetting temperature of the thermosetting resin 110.

Furthermore, Patent Document 2 discloses an example in which preparation was made such that the volumetric ratio of the thermally conductive filler (the first and second fillers) to the total volume of the thermosetting resin 110 and the thermally conductive fillers 111 and 112 was 50% by volume (corresponding to 89% by weight).

In Patent Document 2, since the thermally conductive filler includes the second filler 112 having a melting point lower than the thermosetting temperature of the thermosetting resin 110, the second filler 112 is melted before the thermosetting resin 110 is hardened, and the first filler 111 and the second filler 112 are fusion-bonded to each other. Furthermore, since the thermally conductive filler includes the first filler 111 having a melting point higher than the thermosetting temperature of the thermosetting resin, the first filler 111 maintains its form even after the thermosetting resin 110 is hardened, and thereby, an increase in thermal resistance can be suppressed. Moreover, since the thermally conductive material includes the thermosetting resin 110 and the thermally conductive filler, the bonding temperature can be decreased, and also, since the thermally conductive material contains a resin-based material as a base, the elastic modulus is low, and thermal stress can be decreased. In this way, it is intended to obtain a thermally conductive material having high thermal conductivity and good connection reliability.

Patent Document 1: Japanese Unexamined Patent Application Publication No. 2005-93826

Patent Document 2: Japanese Unexamined Patent Application Publication No. 2004-335872

However, in Patent Document 1, although good conduction properties are ensured in the electrode-connecting parts 105 by fusion-bonding of metal fine particles that are melted at a temperature equal to or lower than the thermosetting temperature of the electroconductive adhesive, the conducting properties are poor in the intermediate connecting part 106 because conduction properties are ensured only by contact between the electroconductive filler particles, which is a problem.

In order to avoid such a problem, a method is conceivable in which low-melting-point metal powder that is melted at the thermosetting temperature of the electroconductive adhesive is incorporated into the electroconductive adhesive.

However, in the case where a bonded structure in which a plurality of electric structures are bonded to each other is mounted on a motherboard or the like, reflow heating treatment may be repeatedly performed, and thermal shock accompanied with a rapid temperature change may be applied to the bonded structure. Thus, there is a possibility that the connected structure may be exposed to a high-temperature atmosphere for a long period of time. This may cause remelting of the low-melting-point metal powder, resulting in difficulty in obtaining sufficient bonding strength. Moreover, in such a case, when melting and hardening are repeated due to thermal shock, etc., there is a possibility that separation may occur at the bonding interfaces between the electrode-connecting parts 105 and the intermediate connecting part 106.

In particular, in the reflow heating treatment, it is becoming common to use Pb-free solder in consideration of the environmental aspects, etc. The Pb-free solder has a high melting temperature of 270° C. to 280° C. Consequently, the hardened metal may be remelted, and separation may be more likely to occur at bonding interfaces.

Furthermore, in Patent Document 2, the content of the thermally conductive filler and the particle sizes of the first filler and the second filler are not taken into consideration. That is, depending on the content of the thermally conductive filler or the particles sizes of the first filler and the second filler, bonding strength with respect to heat-hardened bonding surfaces may be decreased. Furthermore, when exposed to high temperature and high humidity conditions for a long period of time, connection resistance may be increased, and conduction properties may be degraded.

SUMMARY OF THE INVENTION

The present invention has been achieved under these circumstances. It is an object of the invention to provide an electroconductive bonding material which has good conduction properties and high connection strength even when reflow heat treatment is repeatedly carried out or thermal shock accompanied with a rapid temperature change is applied to the electroconductive bonding material, and an electronic apparatus using such an electroconductive bonding material.

In order to achieve the object described above, an electroconductive bonding material according to the present invention contains a thermosetting resin, a first metal powder which is melted at a temperature equal to or lower than the thermosetting temperature of the thermosetting resin, a second metal powder which is not melted at a temperature equal to or lower than the thermosetting temperature of the thermosetting resin and which reacts with the first metal powder to form a reaction product having a high melting point of 300° C. or higher during heat-hardening of the thermosetting resin, and a reducing substance which removes an oxide formed on the surface of the second metal powder. The total content of the first metal powder and the second metal powder is 75% to 88% by weight, and the particle size ratio D1/D2 of the average particle size D1 of the first metal powder to the average particle size D2 of the second metal powder is 0.5 to 6.0.

In the electroconductive bonding material according to the present invention, the volumetric ratio of the first metal powder to the total volume of the first metal powder and the second metal powder may be 25% to 75% by volume.

In the electroconductive bonding material according to the present invention, the second metal powder may be coated with a low-melting-point metal which has a higher wettability to the first metal powder than to the second metal powder and which is melted at a temperature equal to or lower than the thermosetting temperature of the thermosetting resin. Furthermore, the low-melting-point metal may be a metal containing Sn.

Furthermore, in the electroconductive bonding material according to the present invention, it is also preferable that the second metal powder be coated with a metal which has a higher wettability to the first metal powder than to the second metal powder. It is more preferable that the metal having the high wettability be a noble metal.

Furthermore, in the electroconductive bonding material according to the present invention, the first metal powder may be a Sn—Bi alloy powder.

An electronic apparatus according to the present invention includes a first electric structure having a first electrode and a second electric structure having a second electrode. The first electrode and the second electrode are electrically connected to each other through the electroconductive bonding material described above, and at least one interface selected from an interface between the first metal powder and the second metal powder, an interface between the first metal powder and the first electrode, and an interface between the first metal powder and the second electrode is bonded with a reaction product having a high melting point of 300° C. or higher.

The electroconductive bonding material according to the present invention contains a thermosetting resin, a first metal powder (e.g., a Sn—Bi alloy powder) which is melted at a temperature equal to or lower than the thermosetting temperature of the thermosetting resin, a second metal powder (e.g., a Cu powder) which is not melted at a temperature equal to or lower than the thermosetting temperature of the thermosetting resin and which reacts with the first metal powder to form a reaction product having a high melting point of 300° C. or higher during heat-hardening of the thermosetting resin, and a reducing substance which removes an oxide formed on the surface of the second metal powder. The total content of the first metal powder and the second metal powder is 75% to 88% by weight, and the particle size ratio D1/D2 of the average particle size D1 of the first metal powder to the average particle size D2 of the second metal powder is 0.5 to 6.0. Consequently, during heat-hardening, the first metal powder wet-spreads so as to be electrically connected to the second metal powder, thereby forming conductive paths. The first metal powder reacts with the second metal powder to form a high-melting-point reaction product which is not melted at 300° C. In such a manner, it is possible to obtain an electroconductive bonding material having excellent conduction properties, strong bonding force, and excellent connection reliability.

In particular, in the case where the first metal powder contains Bi in which volumetric expansion is small during melting as in a Sn—Bi alloy powder, even when the first metal powder wet-spreads insufficiently over the second metal powder and a high-melting-point reaction product is not formed sufficiently, breakage of bonding interfaces due to volumetric expansion during melting does not easily occur, and thus, good bonding strength can be secured.

Furthermore, the volumetric ratio of the first metal powder to the total volume of the first metal powder and the second metal powder is 25% to 75% by volume. Consequently, the volumetric ratio of the first metal powder can be maintained in the proper range, and many conductive paths can be formed easily. That is, shortage of the first metal powder or remaining of the first metal powder that does not react with the second metal powder can be suppressed, and it is possible to obtain an electroconductive bonding material in which desired conduction properties and connection reliability can be secured.

Furthermore, the second metal powder is coated with a low-melting-point metal (e.g., Sn) which has a higher wettability to the first metal powder than to the second metal powder and which is melted at a temperature equal to or lower than the thermosetting temperature of the thermosetting resin. Consequently, the first metal powder wet-spreads easily over the surface of the second metal powder during heat-hardening of the thermosetting resin. As a result, it is possible to accelerate the formation of a high-melting-point reaction product having a melting point of 300° C. or higher. Thus, conductive paths having better conduction properties can be formed, and the bonding strength at bonding interfaces can be further improved.

Furthermore, in the case where the second metal powder is coated with a metal (e.g., a noble metal such as Au) which has a higher wettability to the first metal powder than to the second metal powder, the same advantages as those described above can be obtained.

In the electronic apparatus according to the present invention, the first electrode of the first electric structure and the second electrode of the second electric structure are electrically connected to each other through the electroconductive bonding material described above, and at least one interface selected from the interface between the first metal powder and the second metal powder, the interface between the first metal powder and the first electrode, and the interface between the first metal powder and the second electrode is bonded with a high-melting-point reaction product having a high melting point of 300° C. or higher. Therefore, conductive paths having good conduction properties can be formed, and the bonding interfaces are bonded with the high-melting-point reaction product.

Consequently, even in the case where, after the first electrical structure and the second electrical structure are bonded to each other, reflow heating treatment is performed or thermal shock is applied and the bonded structure is exposed to a high-temperature atmosphere for a long period of time, occurrence of remelting of the metal can be avoided, bonding interfaces are not separated, and it is possible to obtain an electronic apparatus having good conduction properties, high interfacial bonding strength, and excellent mechanical strength.

Figure 1:
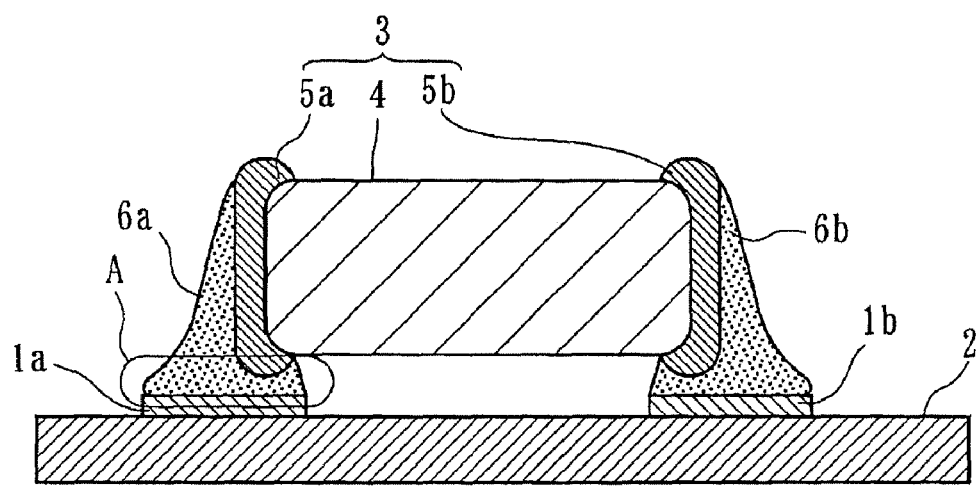
FIG. 1 is a schematic cross-sectional view showing an electronic apparatus according to an embodiment of the present invention, which is produced using an electroconductive bonding material according to the present invention.

REFERENCE NUMERALS 1a, 1b land electrode (first electrode)
2 substrate (first electric structure)
3 chip electronic component (second electric structure)
5a, 5b external electrode (second electrode)
6a, 6b electroconductive bonding material
7 thermosetting resin
8 low-melting-point metal powder (first metal powder)
9 high-melting-point metal powder (second metal powder)

DETAILED DESCRIPTION OF THE INVENTION

Embodiments of the present invention will now be described.

FIG. 1 is a schematic cross-sectional view showing an electronic apparatus according to an embodiment, which is produced using an electroconductive bonding material according to the present invention.

In this electronic apparatus, a chip electronic component (second electric structure) 3, such as a ceramic capacitor, is mounted on a substrate (first electric structure) 2, such as a printed circuit board, provided with land electrodes (first electrodes) 1a and 1b.

The chip electronic component 3 includes an electronic component body 4 containing a ceramic material as a main constituent, and external electrodes (second electrodes) 5a and 5b disposed on both ends thereof. The external electrodes 5a and 5b are electrically connected to the land electrodes 1a and 1b, respectively, with an electroconductive bonding material 6a or 6b.

Figure 2:
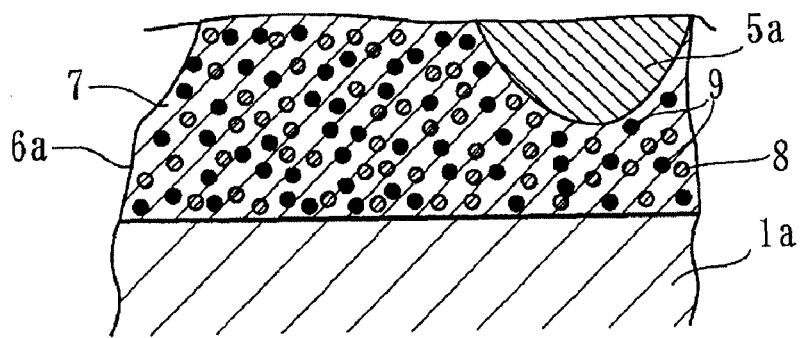
FIG. 2 is an enlarged view of the portion A of FIG. 1 before heat-hardening.

FIG. 2 is an enlarged view of the portion A of FIG. 1 before heat-hardening.

The electroconductive bonding material 6a contains a thermosetting resin 7 having a thermosetting temperature of, for example, about 200° C., a low-melting-point metal powder (first metal powder) 8 which is melted at a temperature equal to or lower than the thermosetting temperature of the thermosetting resin 7, a high-melting-point metal powder (second metal powder) 9 which is not melted at a temperature equal to or lower than the thermosetting temperature of the thermosetting resin 7 and which reacts with the low-melting-point metal powder 8 to form a high-melting-point reaction product having a high melting point of 300° C. or higher during heat-hardening of the thermosetting resin 7, and a reducing substance (not shown) which removes an oxide formed on the surface of the high-melting-point metal powder 9.

That is, in the electroconductive bonding material 6a, the low-melting-point metal powder 8, the high-melting-point metal powder 9, and the reducing substance (not shown) are dispersed in the thermosetting resin 7.

The reaction product refers to, as described above, a high-melting-point reaction product having a melting point of 300° C. or higher formed by reaction between the low-melting-point metal powder and the high-melting-point metal powder. Specifically, the reaction product means an intermetallic compound or a solid solution.

Figure 3:
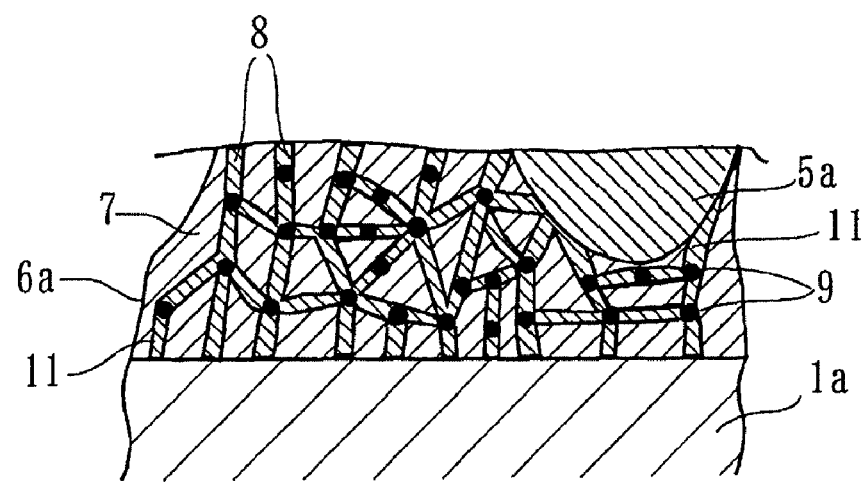
FIG. 3 is an enlarged view of the portion A of FIG. 1 after heat-hardening.

FIG. 3 is an enlarged view of the portion A of FIG. 1 after heat-hardening.

When the electroconductive bonding material 6a is applied onto the external electrode 5a and the land electrode 1a and heat treatment is performed at a temperature equal to or higher than the thermosetting temperature, the low-melting-point metal powder 8 wet-spreads. Then, particles of the high-melting-point metal powder 9 are connected through the low-melting-point metal powder 8, resulting in formation of many conductive paths 11.

That is, the high-melting-point metal powder 9 is not melted at the thermosetting temperature of the thermosetting resin 7. Therefore, even if the high-melting-point metal powder 9 only is dispersed in the thermosetting resin 7, it is difficult to form the conductive paths 11.

Accordingly, in this embodiment, by dispersing the low-melting-point metal powder 8 which is melted at a temperature equal to or lower than the thermosetting temperature of the thermosetting resin 7 in the thermosetting resin 7 and by heating at a temperature equal to or higher than the thermosetting temperature, the low-melting-point metal powder 8 is melted and wet-spread. Thereby, particles of the high-melting-point metal powder 9 are connected through the low-melting-point metal powder 8, and many conductive paths 11 having good conduction properties are formed.

The low-melting-point metal powder 8 reacts with the high-melting-point metal powder 9 to form a high-melting-point reaction product having a melting point of 300° C. or higher. Consequently, even in the case where the workpiece is exposed to high temperature and high humidity for a long period of time, such as the case where reflow heating treatment is performed using Pb-free solder or thermal shock or the like is repeatedly applied to the workpiece, the metal at bonding interfaces is not remelted, and thus it is possible to obtain an electronic apparatus having high bonding strength.

Furthermore, the molten low-melting-point metal powder also spreads over the land electrodes 1a and 1b and the external electrodes 5a and 5b. Therefore, a high-melting-point reaction product is also formed between the low-melting-point metal powder and a metal, such as Ag—Pd or Sn contained in the land electrodes 1a and 1b and the external electrodes 5a and 5b. Thereby, it is also possible to obtain an electronic apparatus having high mechanical strength in which the bonding strength between the land electrode 1a and the external electrode 5a and between the land electrode 1b and the external electrode 5b is enhanced.

Furthermore, the electroconductive bonding material contains the reducing substance, and thereby, it is possible to remove an oxide formed on the surface of the high-melting-point metal powder 9. That is, by removing the oxide formed on the surface, the low-melting-point metal powder 8 easily spreads over the surfaces of particles of the high-melting-point metal powder 9 during heat-hardening of the thermoplastic resin 7. Therefore, conductive paths 11 having higher conduction properties are formed, and formation of a high-melting-point reaction product can be accelerated. Thereby, it is also possible to obtain an electronic apparatus in which the bonding strength between the land electrode 1a and the external electrode 5a and between the land electrode 1b and the external electrode 5b is further enhanced.

As such a reducing substance, a substance having reducing properties, for example, an organic acid such as succinic acid or acetic acid, hydrochloric acid, or oxalic acid can be preferably used. A substance other than an acid can also be used as long as it has reducing properties.

As described above, according to this embodiment, it is possible to obtain an electronic apparatus in which the land electrodes 1a and 1b are respectively bonded to the external electrodes 5a and 5b at bonding interfaces with very high bonding strength while ensuring good conduction properties.

Furthermore, in this embodiment, the content of the low-melting-point metal powder 8 and the high-melting-point metal powder 9, i.e., the total content of metal powder, in the electroconductive bonding material 6a or 6b is set at 75% to 88% by weight.

That is, when the total content of metal powder in the electroconductive bonding material 6a or 6b is decreased to less than 75% by weight, even if the low-melting-point metal powder 8 wet-spreads during heat-hardening, the low-melting-point metal powder 8 is not connected to the high-melting-point metal powder 9 because of the excessively low content of metal powder in the electroconductive bonding material 6a or 6b. Thus, it is difficult to form the conductive paths 11, and it is not possible to sufficiently form the high-melting-point reaction product having a melting point of 300° C. or higher. This results in a decrease in conduction properties. In particular, when the workpiece is left to stand under high-temperature and high-humidity conditions for a long period of time, the decrease in conduction properties is increased.

On the other hand, when the total content of metal powder in the electroconductive bonding material 6a or 6b exceeds 88% by weight, the bonding strength between the land electrode 1a and the external electrode 5a or between the land electrode 1b and the external electrode 5b may be decreased because of the excessively low content of the thermosetting resin 7 in the electroconductive bonding material 6a or 6b.

Accordingly, in this embodiment, the total content of metal powder in the electroconductive bonding material 6a or 6b is set in the range of 75% to 88% by weight.

Furthermore, the particle size ratio D1/D2 of the average particle size D1 of the low-melting-point metal powder 8 to the average particle size D2 of the high-melting-point metal powder 9 is set in the range of 0.5 to 6.0.

Figure 4:
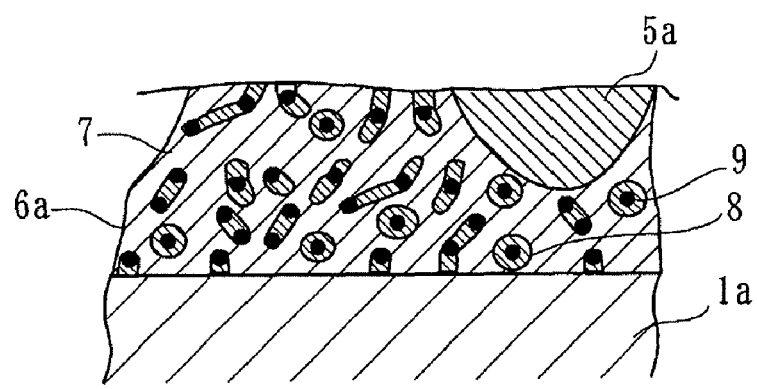
FIG. 4 is a cross-sectional view schematically showing a hardened state of an electroconductive bonding material in the case where the average particle size of a low-melting-point metal is excessively small relative to the average particle size of a high-melting-point metal.

That is, when the particle size ratio D1/D2 is less than 0.5, the average particle size D1 of the low-melting-point metal powder 8 is excessively small relative to the average particle size D2 of the high-melting-point metal powder 9, and the distance between the particles of the high-melting-point metal powder 9 is large compared with the average particle size D1 of the low-melting-point metal powder 8. As shown in FIG. 4, portions occur where the low-melting-point metal powder 8 cannot connect the particles of the high-melting-point metal powder 9 to each other, and conductive paths 11 cannot be formed. Consequently, in some part of the workpiece, the land electrodes 1a and 1b cannot be strongly connected to the external electrodes 5a and 5b, respectively, through a high-melting-point reaction product, and there is a possibility that the connection resistance may be degraded when exposed to high temperature and high humidity for a long period of time.

Figure 5:
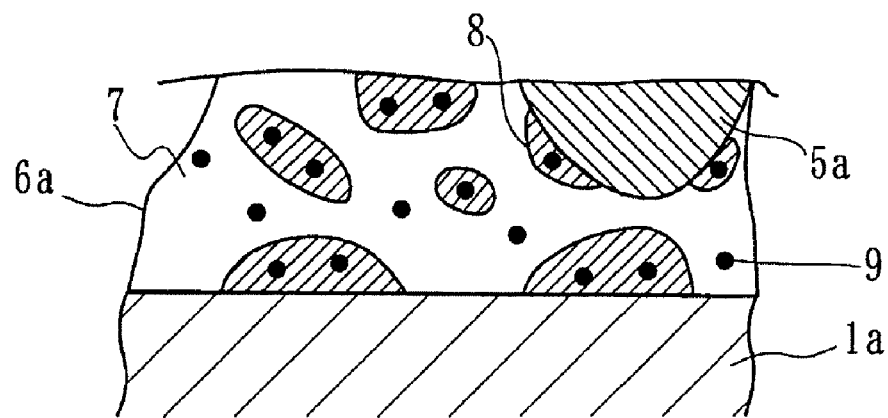
FIG. 5 is a cross-sectional view schematically showing a hardened state of an electroconductive bonding material in the case where the average particle size of a low-melting-point metal is excessively large relative to the average particle size of a high-melting-point metal.
Figure 6:
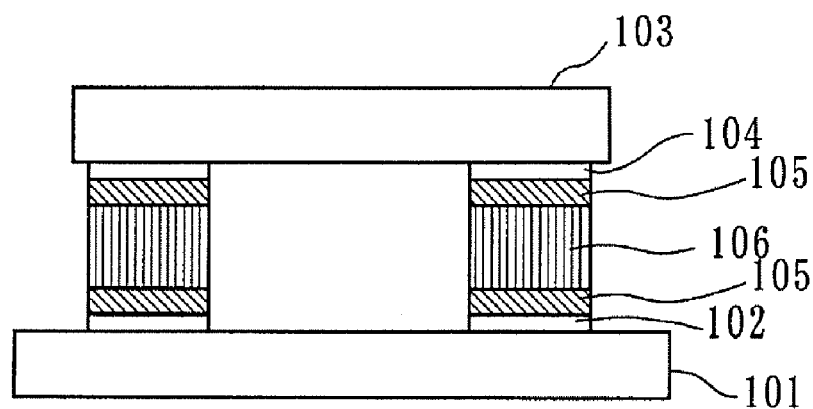
FIG. 6 is a schematic diagram of a connected structure described in Patent Document 1.
Figure 7:
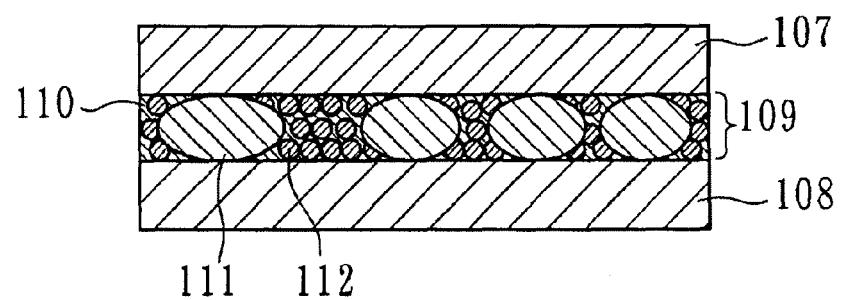
FIG. 7 is a schematic diagram of a thermally conductive bonded member described in Patent Document 2.

On the other hand, when the particle size ratio D1/D2 exceeds 6.0, the average particle size D1 of the low-melting-point metal powder 8 is excessively large relative to the average particle size D2 of the high-melting-point metal powder 9, and the dispersion state of the low-melting-point metal powder 8 and the high-melting-point metal powder 9 in the electroconductive bonding material degrades. As shown in FIG. 5, particles of the low-melting-point metal powder 8 are fusion-bonded to each other during heat-hardening. Consequently, formation of conductive paths 11 which connect between particles of the high-melting-point metal powder 9 is insufficient. Furthermore, a high-melting-point reaction product may not be sufficiently obtained, the bonding strength between the land electrode 1a and the external electrode 5a and between the land electrode 1b and the external electrode 5b may be degraded, and the low-melting-point metal powder 8 may be remelted due to reflow heating treatment, resulting in degradation in conduction properties.

Accordingly, in this embodiment, the particle size ratio D1/D2 of the average particle size D1 of the low-melting-point metal powder 8 to the average particle size D2 of the high-melting-point metal powder 9 is set in the range of 0.5 to 6.0.

Furthermore, as the thermosetting resin 7, any thermosetting resin may be used without particular limitations as long as it exhibits good adhesion properties when subjected to heat-hardening treatment and it exhibits sufficient bonding strength between the land electrode 1a and the external electrode 5a and between the land electrode 1b and the external electrode 5b. Examples thereof include epoxy-based, phenolic, and acrylic thermosetting resins and polyimide, polyurethane, melamine, and urea thermosetting resins. An epoxy-based thermosetting resin is particularly preferably used. Examples of the epoxy-based thermosetting resin that can be preferably used include epoxy resins of bisphenol F type, bisphenol A type, hydrogenated bisphenol F type, phenol novolac type, glycidylamine type, naphthalene type, cyclopentadiene type, cyclohexane type, hexane-tetrahydroxy phenol-ethane type, hydantoin type, polyglycol type, and ether type epoxy resins; and modified epoxy resins obtained by modifying these epoxy resins with silicone, rubber, urethane, chelate, etc. Among the epoxy-based thermosetting resins, liquid type resins, such as bisphenol F type epoxy resins and bisphenol A type epoxy resins, are preferable from environmental and working viewpoints because they do not need an organic solvent for maintaining workability, and also are more preferable from the standpoint that an organic solvent does not volatilize to form voids in bonding interfaces when the thermosetting resin is heat-hardened.

Furthermore, as the low-melting-point metal powder 8, any metal powder may be used without particular limitations as long as it is not melted at the thermosetting temperature of the thermosetting resin 7. Examples thereof include Sn, In, Sn—Bi, Sn—In, Sn—In—Bi, and Sn—Pb. However, use of a Bi-based alloy in which volumetric expansion is small during melting, such as Sn—Bi, is preferable. By using a low-melting-point metal powder 8 containing Bi in which volumetric expansion is small during melting, breakage of bonding interfaces due to volumetric expansion during melting does not easily occur, and thus, high bonding strength can be obtained.

That is, when low-temperature heat treatment is necessitated in consideration of influences on other electronic components mounted on a motherboard or the like, there is a possibility that wet-spreading of the low-melting-point metal powder 8 over the high-melting-point metal powder 9 may be insufficient and a high-melting-point reaction product may not be sufficiently formed.

However, even in such a case, by using a low-melting-point metal powder 8 containing Bi in which volumetric expansion is small during melting, breakage of bonding interfaces due to volumetric expansion does not easily occur, and good bonding strength can be secured between the land electrode 1a and the external electrode 5a and between the land electrode 1b and the external electrode 5b.

Furthermore, as the high-melting-point metal powder 9, any metal powder may be used without particular limitations as long as it is not melted at a temperature equal to or lower than the thermosetting temperature of the thermosetting resin 7 and it reacts with the low-melting-point metal powder 8 to form a high-melting-point reaction product having a melting point of 300° C. or higher during heat-hardening of the thermosetting resin 7. Examples thereof include Ti, Cr, Au, Ag, Cu, Ni, Pt, Bi, Zn, Pd, Pb, Mo, and Sn, and alloys of these metals. In view of cost, conduction properties, corrosiveness, and reactivity with the low-melting-point metal powder 8, use of Cu is preferable.

When a Sn alloy, such as Sn—Bi, is used as the low-melting-point metal powder 8 and Cu is used as the high-melting-point metal powder 9, the Sn component contained in the low-melting-point metal powder 8 reacts with Cu during heat-hardening to form an intermetallic compound, such as $Cu_6Sn_5$ or $Cu_3Sn$. When a Sn alloy, such as Sn—Bi, is used as the low-melting-point metal powder 8 and Au is used as the high-melting-point metal powder 9, an intermetallic compound composed of $AuSn_4$ is formed. By use of Ag, an intermetallic compound composed of $AgSn_3$ is formed, and by use of Ni, an intermetallic compound composed of $Ni_3Sn$ is formed. These intermetallic compounds are high-melting-point reaction products having a melting point of 300° C. or higher. Thus, even when reflow heating treatment is repeatedly carried out or thermal shock accompanied with a rapid temperature change is repeatedly applied, bonding interfaces are not remelted, and strong bonding strength can be ensured.

It is to be understood that the present invention is not limited to the embodiment described above, and various modifications are possible.

For example, the volumetric ratio of the low-melting-point metal powder 8 to the total volume of the metal powder (the low-melting-point metal powder 8 and the high-melting-point metal powder 9) is preferably 25% to 75% by volume.

This is because if the volumetric ratio of the low-melting-point metal powder 8 to the total volume of the metal powder is less than 25% by volume, the volumetric ratio of the low-melting-point metal powder 8 is low, and there is a tendency in which formation of conductive paths 11 is prevented, resulting in degradation in conduction properties. On the other hand, if the volumetric ratio of the low-melting-point metal powder 8 to the total volume of the metal powder exceeds 75% by weight, unreacted low-melting-point metal powder 8 which does not react with the high-melting-point metal powder 9 may remain, and there is a tendency in which conduction properties degrade and connection reliability at high temperatures decreases.

Furthermore, it is also preferable to coat the high-melting-point metal powder 9 with a metal which has a higher wettability to the low-melting-point metal powder 8 than to the high-melting-point metal powder 9. By coating the high-melting-point metal powder 9 with a metal which has a higher wettability to the low-melting-point metal powder 8 than to the high-melting-point metal powder 9, the low-melting-point metal powder 8 easily wet-spreads over the surfaces of particles of the high-melting-point metal powder 9 during heat-hardening of the thermosetting resin 7. As a result, it is possible to accelerate the formation of a high-melting-point reaction product having a melting point of 300° C. or higher, conductive paths 11 having higher conduction properties can be formed, and higher interfacial bonding strength can be obtained.

Examples of such a metal having high wettability that can be used include metals which are melted at a temperature equal to or lower than the thermosetting temperature of the thermosetting resin, such as Sn, Sn—Bi, Sn—In, and Sn—Bi—In; and noble metals, such as Au, Ag, Pt, and Pd. In view of cost, strength of the high-melting-point reaction product, and durability, use of Sn or Sn—In is preferable.

As the metal having high wettability, it is also possible to use a metal species which is not melted at the thermosetting temperature of the thermosetting resin and which is enabled to be melted at the thermosetting temperature of the thermosetting resin by reaction with the low-melting-point metal powder 8.

Examples of the present invention will now be specifically described.

EXAMPLE 1

[Preparation of Electroconductive Bonding Material]

A bisphenol-F type liquid epoxy resin as a thermosetting resin, tert-butyl glycidyl ether as a reactive diluent, an amine compound as a curing agent, a mixture of a boron compound and an epoxy resin as a reaction inhibitor for the curing agent, and succinic acid as a reducing substance were prepared.

A Sn-58Bi powder (specific gravity: 8.93) (low-melting-point metal powder) having an average particle size D1 of 10 μm and a melting point of 139° C. was prepared, and a Cu powder (specific gravity: 8.75) (high-melting-point metal powder) having an average particle size D2 of 5 μm and a melting point of about 1,080° C. was prepared. The particle size ratio D1/D2 of the average particle size D1 of the Sn-58Bi powder to the average particle size D2 of the Cu powder was 2.0.

Next, 25 parts by weight each of tert-butyl glycidyl ether and the amine compound, 12.5 parts by weight of the mixture of the boron compound and the epoxy resin, and 15 parts by weight of succinic acid relative to 100 parts by weight of the bisphenol-F type liquid epoxy resin were weighed. Furthermore, weighing was carried out so that the total content of metal powder (Sn-58Bi powder and Cu powder) was 70% to 93% by weight and the volumetric ratio of the Sn-58Bi powder to the total volume of the metal powder was 50% by volume. The weighed materials were placed in a mortar and mixed by stirring with a pestle. Thus, electroconductive bonding materials of Sample Nos. 1 to 6 were produced.

[Production of Evaluation Samples]

Ag—Pd paste was applied to predetermined positions on an alumina substrate with a thickness of 0.7 mm, followed by baking treatment. A pair of land electrodes were disposed at a distance of 0.8 mm on the alumina substrate.

Next, using a metal mask with a thickness of 50 μm, each of the electroconductive bonding materials was applied to the land electrodes of the corresponding sample.

Next, a chip resistor component having external electrodes composed of Sn and having a size of 1.6 mm in length, 0.8 mm in width, and 0.8 mm in thickness was placed on each of the electroconductive bonding materials, and heat treatment was carried out in an air oven at a temperature of 200° C. for 30 minutes. Thereby, samples of Sample Nos. 1 to 6 were obtained.

[Evaluation of Properties]

With respect to each of the samples of Sample Nos. 1 to 6, the initial value $R_0$ of connection resistance between the land electrodes was measured using a Milliohm HiTESTER (manufactured by HIOKI Corp.: Model 3224), and the initial value $S_0$ of bonding strength was measured using a bond tester (manufactured by DAGE Corp.: Series 4000).

Next, under high-temperature and high-humidity conditions at a temperature of 105° C. and a humidity of 100%, a pressure cooker test (PCT) was carried out for 48 hours, and the resistance $R_1$ and bonding strength $S_1$ after PCT were measured. Furthermore, the rate of change in resistance $\Delta R_1$ after PCT was calculated on the basis of formula (1) described below.

$$\Delta R_1 = (R_1 - R_0)/R_0 \times 100 \qquad (1)$$

Furthermore, with respect to each of the samples of Sample Nos. 1 to 6, reflow heat treatment was carried out by passing the sample through a reflow furnace five times, the maximum temperature of the reflow furnace being adjusted at 270° C. Then, the resistance $R_2$ and bonding strength $S_2$ after reflow heat treatment were measured, and the rate of change in resistance $\Delta R_2$ after reflow was calculated on the basis of formula (2) below.

$$\Delta R_2 = (R_2 - R_0)/R_0 \times 100 \qquad (2)$$

Table 1 shows the specifications of the electroconductive bonding materials of Sample Nos. 1 to 6 and the test results.

TABLE 1

| Sample No. | Total content of metal powder (wt %) | Volumetric ratio of (Sn—58Bi) (vol %) | Average particle size Sn—58Bi D1 (μm) | Average particle size Cu D2 (μm) | Particle size ratio D1/D2 (—) | Connection resistance Initial value $R_0$ (mΩ) | Connection resistance Rate of change in resistance after PCT $\Delta R_1$ (%) | Connection resistance Rate of change in resistance after reflow $\Delta R_2$ (%) | Bonding strength Initial value $S_0$ (N/mm²) | Bonding strength After PCT $S_1$ (N/mm²) | Bonding strength After reflow $S_2$ (N/mm²) | Evaluation |
|---|---|---|---|---|---|---|---|---|---|---|---|---|
| 1* | 70 | 50 | 10 | 5 | 2.0 | 470 | 390 | −76 | 41 | 14 | 37 | X |
| 2 | 75 | | | | | 120 | 16 | −15 | 26 | 22 | 22 | ○ |
| 3 | 83 | | | | | 58 | 3 | −25 | 29 | 21 | 20 | ⊙ |
| 4 | 86 | | | | | 21 | 8 | 5 | 31 | 25 | 20 | ⊙ |
| 5 | 88 | | | | | 96 | 2 | −2 | 15 | 10 | 16 | ○ |
| 6* | 93 | | | | | 130 | 5 | −10 | 7 | 4 | 2 | X |

*Out of the scope of the present invention

The evaluation criteria were as follows: initial value $R_0$ of connection resistance: 200 mΩ or less, rates of change in resistance $\Delta R_1$ and $\Delta R_2$: ±200% or less, and bonding strength: 10 N/mm² or more. Samples that satisfied all the criteria were evaluated as good. Samples that did not satisfy any one of the criteria were evaluated as poor. Among the good samples, samples that satisfied the following conditions were evaluated as very good: initial value $R_0$ of connection resistance: 100 mΩ or less, rates of change in resistance $\Delta R_1$ and $\Delta R_2$: ±100% or less, and bonding strength: 20 N/mm² or more. In Table 1, "very good" is indicated by ⊙, "good" is indicated by ○, and "poor" is indicated by x in the evaluation column.

As is evident from Table 1, in Sample No. 1, the total content of metal powder (Sn-58Bi powder and Cu powder) is 70% by weight, which is less than 75% by weight. Therefore, the initial value $R_0$ of connection resistance is 470 mΩ, which exceeds 200 mΩ; the rate of change in resistance $\Delta R_1$ after PCT is 390%, which exceeds 200%; and the bonding strength after PCT is 14 N/mm², which is less than 20 N/mm². The reason for this is believed to be that, since the content of metal powder in the electroconductive bonding material is low, wet-spreading of the Sn-58Bi powder is insufficient during heat-hardening, conductive paths are not formed sufficiently, and a high-melting-point reaction product with a melting point of 300° C. or higher cannot be obtained sufficiently, resulting in decreases in conduction properties and bonding strength after PCT, and degradation in moisture resistance.

In Sample No. 6, the total content of metal powder (Sn-58Bi powder and Cu powder) is 93% by weight, which exceeds 88% by weight. Therefore, the bonding strength is low, even in terms of the initial value $S_0$, at 7 N/mm² and decreases to 4 N/mm² and 2 N/mm² after PCT and after reflow treatment, respectively. The reason for this is believed to be that, since the resin component for securing mechanical adhesion at bonding interfaces is relatively low, the bonding strength is decreased.

In contrast, in Sample Nos. 2 to 5, the total content of metal powder is 75% to 88% by weight, and the particle size ratio D1/D2 of the average particle size D1 of the Sn-58Bi powder to the average particle size D2 of the Cu powder is 2.0, which are within the ranges of the present invention. The volumetric ratio of Sn-58Bi powder to the total volume of metal powder is 50% by volume, which is within the preferable range. Therefore, the initial value $R_0$ of connection resistance is 21 to 130 m$\Omega$, the rate of change in resistance $\Delta R_1$ after PCT is 2% to 16%, the rate of change in resistance $\Delta R_2$ after reflow is 5% to −25%, and the bonding strength is 15 to 31 N/mm$^2$ in terms of the initial value, 10 to 25 N/mm$^2$ after PCT, and 16 to 22 N/mm$^2$ after reflow, all of which are good results. In particular, in Sample Nos. 3 and 4, in which the total content of metal powder is 83% to 86% by weight, the initial value $R_0$ of connection resistance is 21 to 58 m$\Omega$, the rate of change in resistance $\Delta R_1$ after PCT is 3% to 8%, the rate of change in resistance $\Delta R_2$ after reflow is 5% to −25%, and the bonding strength is 29 to 31 N/mm$^2$ in terms of the initial value, 21 to 25 N/mm$^2$ after PCT, and 20 N/mm$^2$ after reflow, all of which are very good results.

Furthermore, after the sample of Sample No. 2 was embedded in a resin, polishing was performed, and the cross section of the interface between the land electrode and the external electrode was observed. As a result, it was confirmed that the Sn-58Bi powder dispersed in the electroconductive bonding material reacted with Sn constituting the external electrode, Ag—Pd constituting the land electrode, and Cu powder to form high-melting-point reaction products, and thereby, good connection reliability was obtained.

EXAMPLE 2

Electroconductive bonding materials of Sample Nos. 11 to 16 were prepared by the same method as in [Example 1] except that, as the high-melting-point powder, Cu powder coated with a Sn layer with a thickness of 0.05 μm (specific gravity: 8.86) (hereinafter referred to as "Sn-coated Cu powder") was used instead of the Cu powder of Example 1.

The initial value $R_0$ of connection resistance and the initial value $S_0$ of bonding strength were measured by the same method/procedure as in [Example 1], and furthermore, the rates of change in resistance $\Delta R_1$ and $\Delta R_2$ and bonding strength $S_1$ and $S_2$ after PCT and after reflow treatment were calculated.

Table 2 shows the specifications of the electroconductive bonding materials of Sample Nos. 11 to 16 and the test results.

TABLE 2

| Sample No. | Total content of metal powder (wt %) | Volumetric ratio of (Sn—58Bi) (vol %) | Average particle size Sn—58Bi D1 (μm) | Average particle size Cu D2 (μm) | Particle size ratio D1/D2 (—) | Coating Material | Coating Thickness (μm) | Connection resistance Initial value $R_0$ (m$\Omega$) |
|---|---|---|---|---|---|---|---|---|
| 11* | 70 | 50 | 10 | 5 | 2.0 | Sn | 0.05 | 330 |
| 12 | 75 | | | | | | | 102 |
| 13 | 83 | | | | | | | 33 |
| 14 | 86 | | | | | | | 36 |
| 15 | 88 | | | | | | | 67 |
| 16* | 93 | | | | | | | 89 |

| Sample No. | Connection resistance Rate of change in resistance after PCT $\Delta R_1$ (%) | Connection resistance Rate of change in resistance after reflow $\Delta R_2$ (%) | Bonding strength Initial value $S_0$ (N/mm$^2$) | Bonding strength After PCT $S_1$ (N/mm$^2$) | Bonding strength After reflow $S_2$ (N/mm$^2$) | Evaluation |
|---|---|---|---|---|---|---|
| 11* | 260 | −53 | 50 | 15 | 48 | X |
| 12 | 14 | −11 | 33 | 26 | 21 | ○ |
| 13 | 2 | 4 | 31 | 21 | 20 | ⊙ |
| 14 | 4 | −18 | 30 | 28 | 21 | ⊙ |
| 15 | 10 | 9 | 17 | 14 | 15 | ○ |
| 16* | 7 | −6 | 16 | 3 | 8 | X |

*Out of the scope of the present invention

As is evident from Table 2, in Sample Nos. 11 to 16, the same tendencies as in Sample Nos. 1 to 6 were obtained.

That is, in Sample No. 11, the total content of metal powder (Sn-58Bi powder and Sn-coated Cu powder) is 70% by weight, which is less than 75% by weight. Therefore, for the same reason as in Sample No. 1, the initial value $R_0$ of connection resistance is 330 m$\Omega$, which exceeds 200 m$\Omega$; the rate of change in resistance $\Delta R_1$ after PCT is 260%, which exceeds 200%; and the bonding strength after PCT is 15 N/mm$^2$, which is less than 20 N/mm$^2$.

In Sample No. 16, the total content of metal powder is 93% by weight, which exceeds 88% by weight. Therefore, for the same reason as in Sample 6, the bonding strength is low, even in terms of the initial value $S_0$, at 16 N/mm$^2$ and decreases to 3 N/mm$^2$ and 8 N/mm$^2$ after PCT and after reflow treatment, respectively.

In contrast, in Sample Nos. 12 to 15, the content of metal powder is 75% to 88% by weight, and the particle size ratio D1/D2 of the average particle size D1 of the Sn-58Bi powder to the average particle size D2 of the Sn-coated Cu powder is 2.0, which are within the ranges of the present invention. The volumetric ratio of Sn-58Bi powder to the total volume of metal powder is 50% by volume, which is within the preferable range. Therefore, the initial value $R_0$ of connection resistance is 33 to 102 m$\Omega$, the rate of change in resistance $\Delta R_1$ after PCT is 2% to 14%, the rate of change in resistance $\Delta R_2$ after reflow is 4% to −18%, and the bonding strength is 17 to 33 N/mm$^2$ in terms of the initial value, 14 to 28 N/mm$^2$ after PCT, and 15 to 21 N/mm$^2$ after reflow, all of which are good results. In particular, in Sample Nos. 13 and 14, in which the total content of metal powder is 83% to 86% by weight, the initial value $R_0$ of connection resistance is 33 to 36 m$\Omega$, the rate of change in resistance $\Delta R_1$ after PCT is 2% to 4%, the rate of change in resistance $\Delta R_2$ after reflow is 4% to −18%, and the bonding strength is 30 to 31 N/mm² in terms of the initial value, 21 to 25 N/mm² after PCT, and 20 to 21 N/mm² after reflow, all of which are very good results.

In comparison with [Example 1], it was found that, in general, both the connection resistance and the bonding strength improve. The reason for this is believed to be that since the Cu powder is coated with Sn which has high wettability to the Sn-58Bi powder, formation of conductive paths and formation of high-melting-point reaction products are accelerated.

EXAMPLE 3

Using Sn-58Bi powder (specific gravity: 8.93) as low-melting-point metal powder, and using Sn-coated Cn powder (specific gravity: 8.86) as high-melting-point metal powder, electroconductive bonding materials of Sample Nos. 21 to 25 were prepared by the same method as in [Example 1], the electroconductive bonding materials having different particle size ratios D1/D2 in the range of 0.2 to 10.0.

The initial value $R_0$ of connection resistance and the initial value $S_0$ of bonding strength were measured by the same method/procedure as in [Example 1], and furthermore, the rates of change in resistance $\Delta R_1$ and $\Delta R_2$ and bonding strength $S_1$ and $S_2$ after PCT and after reflow treatment were calculated.

Table 3 shows the specifications of the electroconductive bonding materials of Sample Nos. 21 to 25 and the test results.

conditions for a long period of time, connection resistance increases, and conduction properties degrade.

In sample No. 25, the particle size ratio D1/D2 is 10.0, which exceeds 6.0. Therefore, the rate of change in resistance $\Delta R_2$ after reflow is 1,070%, which far exceeds 200%. The bonding strength is low, even in terms of the initial value $S_0$, at 19 N/mm² and decreases to 18 N/mm² and 9 N/mm² after PCT and after reflow treatment, respectively. The reason for this is believed to be that, since the average particle size D1 of the Sn-58Bi powder is excessively large compared to the average particle size D2 of the Sn-coated Cu powder, particles of the Sn-58Bi powder are fusion-bonded to each other during heat-hardening, or the Sn-58Bi powder wet-spreads over the land electrode and the external electrode, and formation of conductive paths which connect between particles of the Sn-coated Cu powder is insufficient. Consequently, bonding strength between the Sn-coated Cu powder and the land electrode and between the Sn-coated Cu powder and the external electrode cannot be sufficiently obtained, resulting in a decrease in bonding force and degradation in heat resistance.

In contrast, in Sample Nos. 21 to 24, the particle size ratio D1/D2 is 0.5 to 6.0, and the total content of metal powder (Sn-58Bi powder and Sn-coated Cu powder) is 86% by weight, which are within the ranges of the present invention. The volumetric ratio of Sn-58Bi powder to the total volume of metal powder is 50% by volume, which is within the preferable range. Therefore, the initial value $R_0$ of connection resistance is 36 to 71 mΩ, the rate of change in resistance $\Delta R_1$ after

TABLE 3

| Sample No. | Total content of metal powder (wt %) | Volumetric ratio of (Sn—58Bi) (vol %) | Average particle size Sn—58Bi D1 (μm) | Average particle size Cu D2 (μm) | Particle size ratio D1/D2 (—) | Coating Material | Coating Thickness (μm) | Connection resistance Initial value $R_0$ (mΩ) |
|---|---|---|---|---|---|---|---|---|
| 21* | 86 | 50 | 10 | 50 | 0.2 | Sn | 0.05 | 129 |
| 22 | | | 10 | 20 | 0.5 | | | 48 |
| 23 | | | 10 | 5 | 2.0 | | | 36 |
| 24 | | | 30 | 5 | 6.0 | | | 71 |
| 25* | | | 50 | 5 | 10.0 | | | 16 |

| Sample No. | Connection resistance Rate of change in resistance after PCT $\Delta R_1$ (%) | Connection resistance Rate of change in resistance after reflow $\Delta R_2$ (%) | Bonding strength Initial value $S_0$ (N/mm²) | Bonding strength After PCT $S_1$ (N/mm²) | Bonding strength After reflow $S_2$ (N/mm²) | Evaluation |
|---|---|---|---|---|---|---|
| 21* | 210 | −73 | 61 | 20 | 52 | X |
| 22 | 18 | −5 | 39 | 25 | 33 | ⊙ |
| 23 | 4 | −18 | 30 | 23 | 21 | ⊙ |
| 24 | 10 | −22 | 32 | 17 | 35 | ○ |
| 25* | 29 | 1070 | 19 | 18 | 9 | X |

*Out of the scope of the present invention

As is evident from Table 3, in Sample No. 21, the particle size ratio D1/D2 is 0.2, which is less than 0.5. Therefore, the rate of change in resistance $\Delta R_1$ after PCT is 210%, which exceeds 200%. The reason for this is believed to be that, since the average particle size D1 of the Sn-58Bi powder is excessively small relative to the distance between particles of the Sn-coated Cu powder, even when the Sn-58Bi powder wet-spreads during heat-hardening, portions occur where particles of the Sn-coated Cu powder cannot be connected well by the Sn-58Bi powder, and thus, conductive paths having good conduction properties cannot be formed sufficiently. As a result, when exposed to high temperature and high humidity PCT is 4% to 18%, the rate of change in resistance $\Delta R_2$ after reflow is −5% to −22%, and the bonding strength is 30 to 39 N/mm² in terms of the initial value, 17 to 25 N/mm² after PCT, and 21 to 35 N/mm² after reflow, all of which are good results. In particular, in Sample Nos. 22 and 23, in which the particle size ratio D1/D2 is 0.5 to 2.0, the initial value $R_0$ of connection resistance is 36 to 48 mΩ, the rate of change in resistance $\Delta R_1$ after PCT is 4% to 18%, the rate of change in resistance $\Delta R_2$ after reflow is −5% to −18%, and the bonding strength is 30 to 39 N/mm² in terms of the initial value, 23 to 25 N/mm² after PCT, and 21 to 33 N/mm² after reflow, all of which are very good results.

EXAMPLE 4

Sn-58Bi powder and Sn-coated Cu powder were prepared, and electroconductive bonding materials of Sample Nos. 31 to 36 were prepared by the same method as in [Example 1], the volumetric ratio of the Sn-58Bi powder to the total volume of metal powder (Si-58Bi powder and Sn-coated Cu powder) varying in the range of 20% to 80% by volume.

Then, the initial value $R_0$ of connection resistance and the initial value $S_0$ of bonding strength were measured by the same method/procedure as in [Example 1], and furthermore, the rates of change in resistance $\Delta R_1$ and $\Delta R_2$ and bonding strength $S_1$ and $S_2$ after PCT and after reflow treatment were calculated.

Table 4 shows the specifications of the electroconductive bonding materials of Sample Nos. 31 to 36 and the test results.

TABLE 4

| Sample No. | Total content of metal powder (wt %) | Volumetric ratio of (Sn—58Bi) (vol %) | Average particle size Sn—58Bi D1 (μm) | Average particle size Cu D2 (μm) | Particle size ratio D1/D2 (—) | Coating Material | Coating Thickness (μm) | Connection resistance Initial value $R_0$ (mΩ) |
|---|---|---|---|---|---|---|---|---|
| 31 | 86 | 20 | 10 | 5 | 2.0 | Sn | 0.05 | 110 |
| 32 |    | 25 |    |   |     |    |      | 46 |
| 33 |    | 50 |    |   |     |    |      | 36 |
| 34 |    | 60 |    |   |     |    |      | 29 |
| 35 |    | 75 |    |   |     |    |      | 98 |
| 36 |    | 80 |    |   |     |    |      | 200 |

| Sample No. | Connection resistance Rate of change in resistance after PCT $\Delta R_1$ (%) | Connection resistance Rate of change in resistance after reflow $\Delta R_2$ (%) | Bonding strength Initial value $S_0$ (N/mm²) | Bonding strength After PCT $S_1$ (N/mm²) | Bonding strength After reflow $S_2$ (N/mm²) | Evaluation |
|---|---|---|---|---|---|---|
| 31 | 110 | −20 | 36 | 10 | 42 | ○ |
| 32 | 41 | −65 | 31 | 20 | 28 | ⊙ |
| 33 | 4 | −18 | 30 | 28 | 21 | ⊙ |
| 34 | 14 | −28 | 35 | 22 | 26 | ⊙ |
| 35 | 39 | −4 | 21 | 20 | 21 | ⊙ |
| 36 | 180 | 150 | 33 | 17 | 10 | ○ |

As is evident from Table 4, the initial value $R_0$ of connection resistance is 46 to 200 mΩ, the rate of change in resistance $\Delta R_1$ after PCT is 4% to 180%, the rate of change in resistance $\Delta R_2$ after reflow is −65% to 150%, and the bonding strength is 21 to 36 N/mm² in terms of the initial value, 10 to 28 N/mm² after PCT, and 10 to 42 N/mm² after reflow, all of which are good results.

However, in Sample No. 31, since the volumetric ratio of Sn-58Bi powder to the total volume of metal powder is 20% by volume, which is lower than 25% by volume, the volumetric ratio of Sn-58Bi powder is low and formation of conductive paths is prevented. Therefore, the initial value $R_0$ of connection resistance is 110 mΩ, the rate of change in resistance $\Delta R_1$ after PCT is 110%, and the bonding strength after PCT is 10 N/mm², which are the levels that cause no problem in practical use, but in which electrical and mechanical strength is low compared with Sample Nos. 32 to 35.

In Sample No. 36, since the volumetric ratio of Sn-58Bi powder to the total volume of metal powder is 80% by volume, which exceeds 75% by volume, Sn-58Bi powder that does not react with Sn-coated Cu powder remains unreacted. Therefore, the initial value $R_0$ of connection resistance is 200 mΩ, the rate of change in resistance $\Delta R_1$ after PCT is 180%, the rate of change in resistance $\Delta R_2$ after reflow is 150%, and the bonding strength is 17 N/mm² after PCT and 10 N/mm² after reflow, which are also the levels that cause no problem in practical use in comparison, but in which conduction properties are low, connection reliability at high temperatures is low, and thus electrical and mechanical strength is poor compared with Sample Nos. 32 to 35.

As a result, it was confirmed that the volumetric ratio of Sn-58Bi powder to the total volume of metal powder is preferably in the range of 25% to 75% by volume.

EXAMPLE 5

An electroconductive bonding material of Sample No. 41 was prepared by the same method/procedure as in [Example 1] except that Sn-58Bi powder with an average particle size D1 of 10 μm and Au-coated Cu powder in which Cu powder with an average particle size D2 of 5 μm was coated with an Au layer with a thickness of 0.02 μm were used.

An electroconductive bonding material of Sample No. 42 was prepared by the same method/procedure as in Sample No. 41 except that, instead of the Au-coated Cu powder described above, In-coated Cu powder in which Cu powder with an average particle size D2 of 5 μm was coated with an In layer with a thickness of 0.01 μm was used.

An electroconductive bonding material of Sample No. 43 was prepared by the same method/procedure as in Sample No. 42 except that a reducing substance was not added in the process of preparing the electroconductive bonding material.

Then, the initial value $R_0$ of connection resistance and the initial value $S_0$ of bonding strength were measured by the same method/procedure as in [Example 1], and furthermore, the rates of change in resistance $\Delta R_1$ and $\Delta R_2$ and bonding strength $S_1$ and $S_2$ after PCT and after reflow treatment were calculated.

Table 5 shows the specifications of the electroconductive bonding materials of Sample Nos. 41 to 43 and the test results.

TABLE 5

| Sample No. | Reducing agent | Total content of metal powder (wt %) | Volumetric ratio of (Sn—58Bi) (vol %) | Average particle size Sn—58Bi D1 (μm) | Average particle size Cu D2 (μm) | Particle size ratio D1/D2 (—) | Coating Material | Coating Thickness (μm) | Connection resistance Initial value $R_0$ (mΩ) |
|---|---|---|---|---|---|---|---|---|---|
| 41 | Succinic acid | 86 | 50 | 10 | 10 | 1.0 | Au | 0.02 | 28 |
| 42 | Succinic acid | | | | 5 | 2.0 | In | 0.01 | 21 |
| 43* | — | | | | 5 | 2.0 | In | 0.01 | 7300 |

| Sample No. | Connection resistance Rate of change in resistance after PCT $\Delta R_1$ (%) | Connection resistance Rate of change in resistance after reflow $\Delta R_2$ (%) | Bonding strength Initial value $S_0$ (N/mm$^2$) | Bonding strength After PCT $S_1$ (N/mm$^2$) | Bonding strength After reflow $S_2$ (N/mm$^2$) | Evaluation |
|---|---|---|---|---|---|---|
| 41 | 4 | −10 | 33 | 25 | 30 | ⊙ |
| 42 | 6 | 35 | 28 | 20 | 27 | ⊙ |
| 43* | 790 | 0 | 51 | 9 | 55 | X |

*Out of the scope of the present invention

As is evident from Table 5, in Sample No. 43, the initial value $R_0$ of connection resistance is 7,300 mΩ, and thus conduction properties are degraded. The rate of change in resistance $\Delta R_1$ after PCT is high at 790%, and the bonding strength after PCT is low at 9 N/mm$^2$. The reason for this is believed to be that, since a reducing agent is not incorporated into the electroconductive bonding material, an oxide is not removed and remains on the surface of the In-coated Cu powder, the Sn-58Bi powder does not easily wet-spread over the surface of the In-coated Cu powder during heat-hardening of the thermosetting resin, and thus formation of a high-melting-point reaction product is not accelerated.

In contrast, in Sample Nos. 41 and 42, the electroconductive bonding materials contain succinic acid serving as a reducing agent, the total content of metal powder is 86% by weight, and the particle size ratio D1/D2 is 2.0, all of which are within the ranges of the present invention. Moreover, the volumetric ratio of Sn-58Bi powder to the total volume of metal powder is 50% by volume, which in the preferably range. Therefore, the initial value $R_0$ of connection resistance is 21 to 28 mΩ, the rate of change in resistance $\Delta R_1$ after PCT is 4% to 6%, the rate of change in resistance $\Delta R_2$ after reflow is 35% to −10%, and the bonding strength is 28 to 33 N/mm$^2$ in terms of the initial value, 20 to 25 N/mm$^2$ after PCT, and 27 to 30 N/mm$^2$ after reflow, all of which are good results.

The invention claimed is:

1. An electroconductive bonding material comprising:
   a thermosetting resin;
   a first metal powder which is melted at a temperature equal to or lower than a thermosetting temperature of the thermosetting resin, wherein the first metal powder is a Sn—Bi alloy powder containing 58 wt. % or more of Bi;
   a second metal powder which is not melted at the temperature equal to or lower than the thermosetting temperature of the thermosetting resin and which reacts with the first metal powder to form a reaction product having a melting point of 300° C. or higher during heat-hardening of the thermosetting resin; and
   a reducing substance which removes an oxide formed on a surface of the second metal powder,
   wherein a total content of the first metal powder and the second metal powder is 75% to 88% by weight, and a particle size ratio D1/D2 of an average particle size D1 of the first metal powder to an average particle size D2 of the second metal powder is 0.5 to 6.0.

2. The electroconductive bonding material according to claim 1, wherein a volumetric ratio of the first metal powder to a total volume of the first metal powder and the second metal powder is 25% to 75% by volume.

3. The electroconductive bonding material according to claim 1, wherein the second metal powder is coated with a low-melting-point metal which is melted at a temperature equal to or lower than the thermosetting temperature of the thermosetting resin, and wherein a first wettability of the low-melting-point metal to the first metal powder is higher than a second wettability of the second metal powder to the first metal powder.

4. The electroconductive bonding material according to claim 3, wherein the second metal powder is a metal powder containing Cu as a main constituent, and the low-melting-point metal is a metal containing Sn.

5. The electroconductive bonding material according to claim 1, wherein the second metal powder is coated with a metal, and wherein a first wettability of the metal to the first metal powder is higher than a second wettability of the second metal powder to the first metal powder.

6. The electroconductive bonding material according to claim 5, wherein the second metal powder is a metal powder containing Cu as a main constituent, and the metal which has a higher wettability is a noble metal.

7. An electronic apparatus comprising:
   a first electric structure having a first electrode; and
   a second electric structure having a second electrode,
   wherein the first electrode and the second electrode are electrically connected to each other through the electroconductive bonding material of claim 1, and
   at least one interface selected from a first interface between the first metal powder and the second metal powder, a second interface between the first metal powder and the first electrode, and a third interface between the first metal powder and the second electrode is bonded with a reaction product having a melting point of 300° C. or higher.

* * * * *